(12) United States Patent
Fukaya et al.

(10) Patent No.: US 12,009,856 B2
(45) Date of Patent: Jun. 11, 2024

(54) OPTICAL COMMUNICATION EQUIPMENT AND COMPONENT MOUNTING MACHINE

(71) Applicant: FUJI CORPORATION, Chiryu (JP)

(72) Inventors: Yoshiyuki Fukaya, Chiryu (JP); Hidenori Niwa, Inazawa (JP)

(73) Assignee: FUJI CORPORATION, Chiryu (JP)

(*) Notice: Subject to any disclaimer, the term of this patent is extended or adjusted under 35 U.S.C. 154(b) by 55 days.

(21) Appl. No.: 17/758,835

(22) PCT Filed: Feb. 7, 2020

(86) PCT No.: PCT/JP2020/004880
§ 371 (c)(1),
(2) Date: Jul. 14, 2022

(87) PCT Pub. No.: WO2021/157068
PCT Pub. Date: Aug. 12, 2021

(65) Prior Publication Data
US 2023/0038831 A1 Feb. 9, 2023

(51) Int. Cl.
*H04B 10/079* (2013.01)

(52) U.S. Cl.
CPC ................. *H04B 10/0795* (2013.01)

(58) Field of Classification Search
CPC ............. H04B 10/07955; H04B 10/2581
See application file for complete search history.

(56) References Cited

U.S. PATENT DOCUMENTS

| | | | |
|---|---|---|---|
| 2006/0268969 A1 | 11/2006 | Kimura et al. | |
| 2008/0085126 A1* | 4/2008 | Kokkinos | H04B 10/071 398/171 |
| 2012/0008937 A1* | 1/2012 | Cheng | H04B 10/272 398/1 |
| 2015/0282342 A1* | 10/2015 | Cox | H05K 5/02 160/241 |
| 2015/0326315 A1* | 11/2015 | Georgiano | H04B 10/25 398/116 |
| 2020/0205641 A1* | 7/2020 | Luck | A61B 46/10 |

FOREIGN PATENT DOCUMENTS

| | | | | |
|---|---|---|---|---|
| CN | 107294596 | * | 12/2019 | ........... H04B 10/079 |
| CN | 107294596 B | | 12/2019 | |
| JP | 3-235536 A | | 10/1991 | |

(Continued)

OTHER PUBLICATIONS

International Search Report dated Apr. 21, 2020, in PCT/JP2020/004880, filed on Feb. 7, 2020, 2 pages.

*Primary Examiner* — Nathan M Cors
(74) *Attorney, Agent, or Firm* — Oblon, McClelland, Maier & Neustadt, L.L.P.

(57) ABSTRACT

An optical communication equipment performs optical communication between a first apparatus and a second apparatus. The optical communication equipment includes a monitoring section configured to monitor a light amount during optical communication, and a control device configured to output predetermined information when the light amount is less than a first threshold value and shut off communication between the first and second apparatuses when the light amount is less than a second threshold value lower than the first threshold value.

6 Claims, 6 Drawing Sheets

LIGHT LEVEL OF OPTICAL COMMUNICATION
IS DECREASING.
PLEASE CLEAN OR REPLACE OPTICAL FIBER CABLE.
PRODUCTION WILL CONTINUE.

(56) References Cited

FOREIGN PATENT DOCUMENTS

| | | | | |
|---|---|---|---|---|
| JP | 4-232438 A | 8/1992 | | |
| JP | 8-125613 A | 5/1996 | | |
| JP | 2016-31975 A | 3/2016 | | |
| JP | 201631975 | * 3/2016 | ............ | H05K 13/04 |
| WO | WO 2005/078969 A1 | 8/2005 | | |
| WO | WO 2014/091577 A1 | 6/2014 | | |

* cited by examiner

OPTICAL COMMUNICATION EQUIPMENT AND COMPONENT MOUNTING MACHINE

TECHNICAL FIELD

The present specification discloses an optical communication equipment and a component mounting machine.

BACKGROUND ART

In related art, a system for performing optical transmission between a fixed body and a moving object by a light transmitter and a light receiver for transmitting and receiving an optical signal has been proposed (see Patent Literature 1, for example). In this system, the light transmitter is provided on a fixed body side. In addition, the light receiver and a recording means for recording the light receiving level of the optical signal received by the light receiver are provided on a moving object side.

PATENT LITERATURE

Patent Literature 1: JP-A-H08-125613

BRIEF SUMMARY

Technical Problem

Although Patent Literature 1 described above describes receiving and recording the light receiving level at the time of optical communication, any countermeasure is not mentioned when the light receiving level is reduced to a level at which it is difficult to appropriately perform optical communication.

It is a main object of the present disclosure to suppress the occurrence of a malfunction in an apparatus due to a decrease in a light amount during optical communication.

Solution to Problem

The present disclosure employs the following means in order to achieve the above-mentioned main object.

An optical communication equipment of the present disclosure is an optical communication equipment for performing optical communication between a first apparatus and a second apparatus, including a monitoring section configured to monitor a light amount during optical communication, and a control device configured to output predetermined information when the light amount is less than a first threshold value and shut off communication between the first and second apparatuses when the light amount is less than a second threshold value lower than the first threshold value.

In the optical communication equipment of the present disclosure, since predetermined information is output when the light amount during optical communication is less than the first threshold value, for example, an operator who has received a warning based on the information performs necessary maintenance, whereby the equipment can be kept normal. In addition, in the optical communication equipment of the present disclosure, since the communication between the first and second apparatuses is shut off when the light amount is less than the second threshold value lower than the first threshold value, it is possible to suppress the equipment from malfunctioning due to the decrease in the light amount during the optical communication.

DESCRIPTION OF EMBODIMENTS

Next, an embodiment of the present disclosure will be described with reference to drawings.

Figure 1:
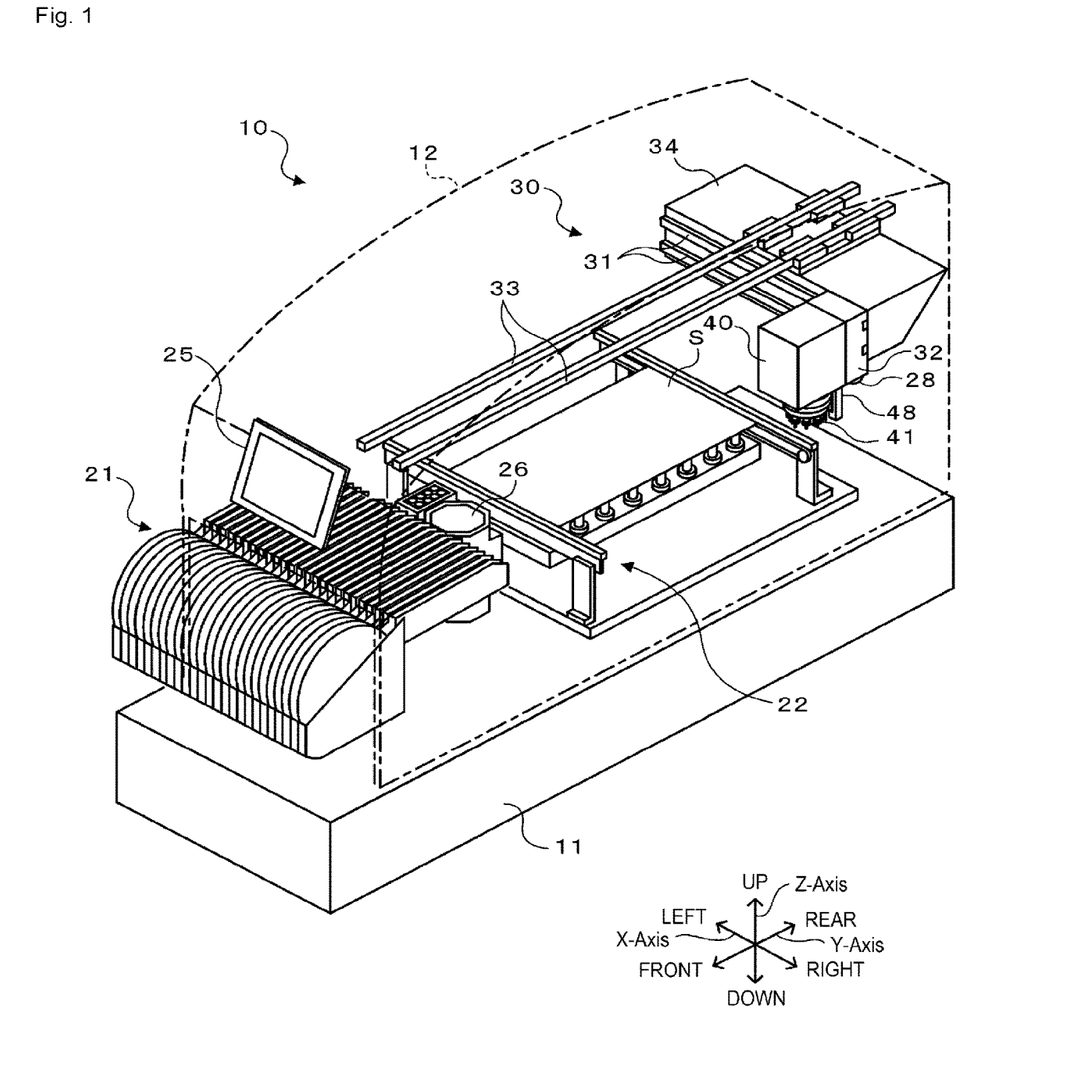
FIG. 1 is a schematic configuration view of a component mounting machine.
Figure 2:
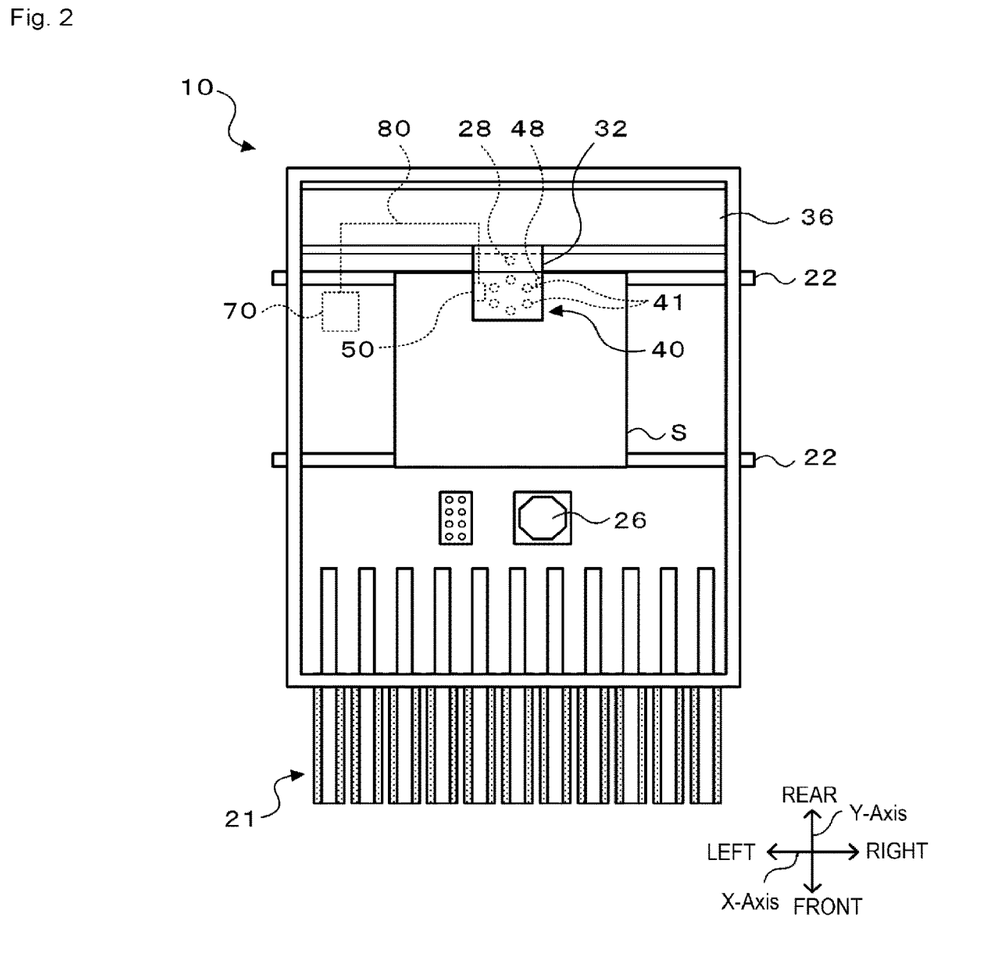
FIG. 2 is a top view of the component mounting machine including an optical communication equipment.
Figure 3:
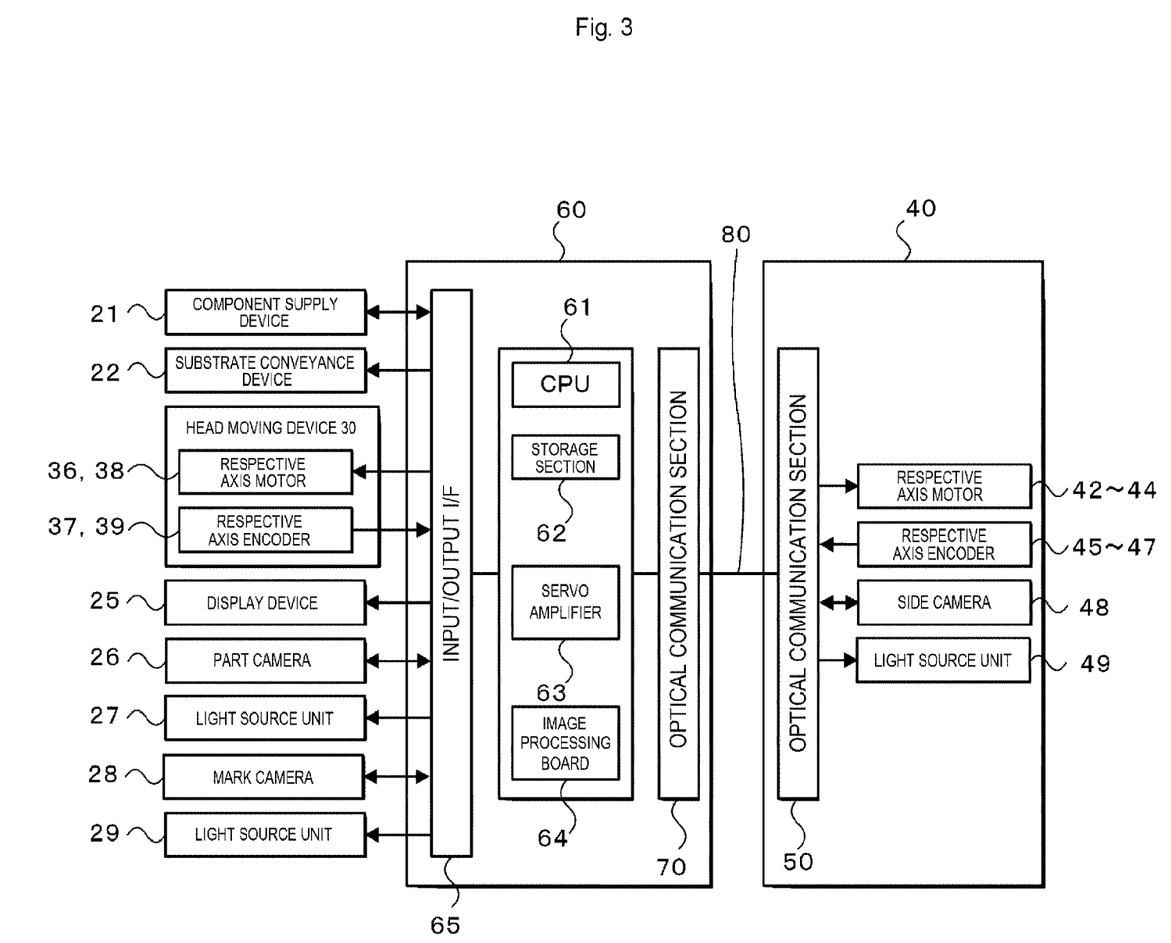
FIG. 3 is a block diagram illustrating an electrical connection relationship between a mounting control device and a head.
Figure 4:
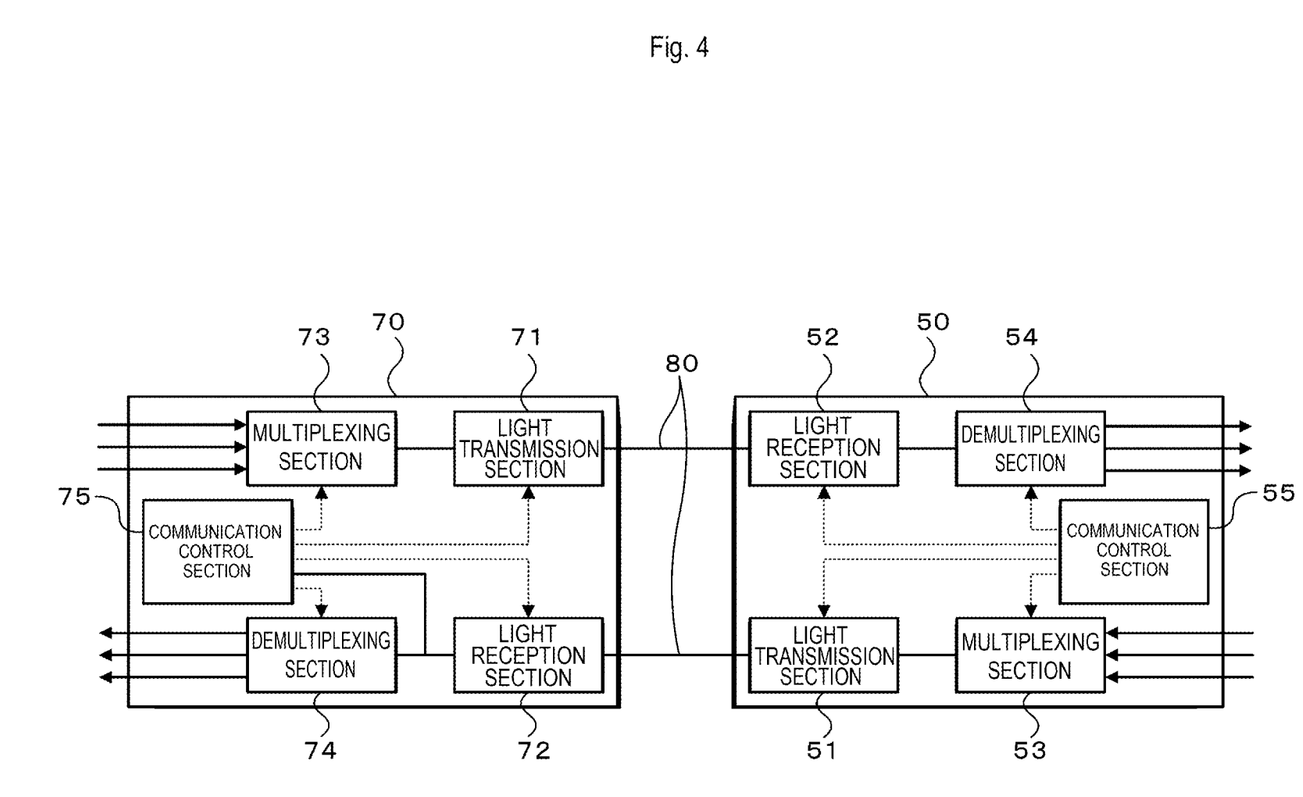
FIG. 4 is a functional block diagram of an optical communication section.

FIG. 1 is a schematic configuration view of a component mounting machine. FIG. 2 is a top view of a component mounting machine including an optical communication equipment. FIG. 3 is a block diagram illustrating an electrical connection relationship between a mounting control device and a head. FIG. 4 is a functional block diagram of an optical communication section. The left-right direction in FIG. 1 is an X-axis direction, the front (front)-rear (back) direction is a Y-axis direction substantially orthogonal to the X-axis direction, and the up-down direction is a Z-axis direction substantially orthogonal to the X-axis direction and the Y-axis direction (horizontal plane).

As illustrated in FIG. 1, component mounting machine 10 includes housing 12 to be installed on base 11, component supply device 21, a mounting machine body including substrate conveyance device 22, head moving device 30, and mounting control device 60 (see FIG. 3), and mounting head 40. In addition to these, component mounting machine 10 also includes part camera 26, display device 25, and the like. Part camera 26 is provided between component supply device 21 and substrate conveyance device 22 to image component P picked up by suction nozzle 41 of mounting head 40 from the lower side. Light source unit 27 for lighting component P as an imaging target is provided around part camera 26. Display device 25 is installed on the front surface of housing 12, and displays status information, error information, and the like of component mounting machine 10.

Component supply device 21 includes, for example, a tape feeder that supplies components accommodated in a tape by drawing and feeding the tape wound on a reel from the reel.

Substrate conveyance device 22 includes a pair of conveyor belts that are provided at intervals in the front-rear direction of FIG. 1 and spanned in the X-axis direction (left-right direction). Substrate S is conveyed from the left to the right in the drawing by the conveyor belts of substrate conveyance device 22.

Head moving device 30 moves mounting head 40 in an XY-direction (front-rear and left-right direction). As illustrated in FIG. 1, head moving device 30 includes X-axis slider 32 and Y-axis slider 34. X-axis slider 32 is supported by a pair of upper and lower X-axis guide rails 31 provided on the front surface of Y-axis slider 34 so as to extend in the X-axis direction (left-right direction), and is movable in the X-axis direction by driving X-axis motor (servo motor) 36 (see FIG. 3). Y-axis slider 34 is supported by a pair of left and right Y-axis guide rails 33 provided on the upper stage portion of housing 12 so as to extend in the Y-axis direction (front-rear direction), and is movable in the Y-axis direction by driving Y-axis motor (servo motor) 38 (see FIG. 3). The position of X-axis slider 32 in the X-axis direction is detected by X-axis encoder 37 (see FIG. 3), and the position of Y-axis slider 34 in the Y-axis direction is detected by Y-axis encoder 39 (see FIG. 3). Mounting head 40 is attached to X-axis slider 32. Therefore, mounting head 40 is movable along an XY-plane (horizontal plane) by driving and controlling head moving device 30 (X-axis motor 36 and Y-axis motor 38). X-axis slider 32 also includes mark camera 28 for imaging and reading a reference mark attached to substrate S from above. Mark camera 28 is connected to a substrate (not illustrated) installed on X-axis slider 32, and is connected to mounting control device 60 via the substrate.

Mounting head 40 is configured as, for example, a rotary head including multiple nozzle holders arranged at equal angular intervals in the circumferential direction. Suction nozzle 41 is detachably attached to a distal end portion of each nozzle holder. Although not illustrated, a suction port communicating with a negative pressure source via a solenoid valve is provided at the distal end portion of suction nozzle 41. Suction nozzle 41 picks up component P with a negative pressure from the negative pressure source supplied in a state in which the solenoid valve is opened.

Mounting head 40 includes an R-axis motor (servo motor) 42 that pivots (revolves) each nozzle holder (suction nozzle 41) in the circumferential direction, θ-axis motor (servo motor) 43 that rotates (spins) each nozzle holder, and Z-axis motor (servo motor) 44 that lifts and lowers (moves up and down) a nozzle holder at a predetermined pivoting position among the respective nozzle holders. In addition, mounting head 40 includes R-axis encoder 45 for detecting the pivoting position (revolving position) of each nozzle holder, θ-axis encoder 46 for detecting the rotational position (spinning position) of each nozzle holder, and Z-axis encoder 47 for detecting the lifting and lowering position (up-down position) of the nozzle holder at a predetermined position.

In addition, mounting head 40 also includes side camera 48 for imaging the distal end of suction nozzle 41 from the side. Around side camera 48, light source unit 49 for lighting suction nozzle 41 as an imaging target and component P picked up by suction nozzle 41 is provided.

In addition, mounting head 40 includes optical communication section 50 that is installed in mounting head 40, transmits various signals to mounting control device 60 (optical communication section 70) by optical communication, and receives various signals from mounting control device 60 (optical communication section 70). Optical communication section 50 receives, as various signals to be transmitted, position signals from the respective axis encoders (R-axis encoder 45, θ-axis encoder 46, and Z-axis encoder 47), image signals from side camera 48, and the like. In addition, optical communication section 50 outputs, as received various signals, control signals to the respective axis motors (R-axis motor 42, θ-axis motor 43, and Z-axis motor 44), control signals to side camera 48, control signals to light source unit 49, and the like.

As illustrated in FIG. 4, optical communication section 50 includes light transmission section 51 that transmits an optical signal, light reception section 52 that receives an optical signal, multiplexing section 53 that multiplexes various signals to be transmitted via light transmission section 51, demultiplexing section 54 that demultiplexes signals received via light reception section 52 into various signals, and communication control section 55 that controls each section. Light transmission section 51 includes a semiconductor laser, and a laser drive circuit that drives the semiconductor laser based on a control signal from communication control section 55. Light reception section 52 has a photoelectric conversion circuit that converts the received optical signal into an electrical signal.

Component mounting machine 10 includes mounting control device 60 that is installed on base 11 and controls the entire mounting machine. As illustrated in FIG. 3, mounting control device 60 includes CPU 61, storage section 62, servo amplifier 63, image processing board 64, input/output interface 65, and optical communication section 70. CPU 61, storage section 62, servo amplifier 63, and image processing board 64 are electrically connected to each other. CPU 61, storage section 62, servo amplifier 63, and image processing board 64 are electrically connected to input/output interface 65 and also electrically connected to optical communication section 70. Storage section 62 includes a RAM for temporarily storing data, a ROM for storing a processing program, an HDD, and the like. Input/output interface 65 is electrically connected to the respective axis encoders (X-axis encoder 37 and Y-axis encoder 39) and respective axis motors (X-axis motor 36 and Y-axis motor 38) of component supply device 21, substrate conveyance device 22, and head moving device 30. In addition, input/output interface 65 is electrically connected to part camera 26, light source unit 27, display device 25, mark camera 28, light source unit 29 disposed around mark camera 28, and the like.

Servo amplifier 63 performs feedback control of each axis motor (servo motor). Servo amplifier 63 receives position signals from the respective axis encoders (X-axis encoder 37 and Y-axis encoder 39) of head moving device 30 via input/output interface 65, generates control signals of the respective axis motors (X-axis motor 36 and Y-axis motor 38) of head moving device 30 based on the input position signals, and outputs the generated control signals to the respective axis motors via input/output interface 65. In addition, servo amplifier 63 receives position signals from the respective axis encoders (R-axis encoder 45, θ-axis encoder 46, and Z-axis encoder 47) of mounting head 40 via optical communication sections 50 and 70, generates control signals of the respective axis motors (R-axis motor 42, θ-axis motor 43, and Z-axis motor 44) of corresponding mounting head 40 based on the input position signals, and outputs the generated control signals to the respective axis motors via optical communication sections 50 and 70.

Image processing board 64 processes image signals imaged by various cameras (part camera 26, mark camera 28, and side camera 48). The image signals from part camera 26 and mark camera 28 are input to image processing board 64 via input/output interface 65, and the image signals from side camera 48 are input via optical communication sections 50 and 70.

As illustrated in FIG. 4, optical communication section 70 includes light transmission section 71 that transmits an optical signal, light reception section 72 that receives an optical signal, multiplexing section 73 that multiplexes various signals to be transmitted via light transmission section 71, demultiplexing section 74 that demultiplexes the signals received via light reception section 72 into various signals, and communication control section 75 that controls each section and exchanges control signals and necessary data with CPU 61. Light transmission section 71 includes a semiconductor laser and a laser drive circuit similar to light transmission section 51, and is connected to light reception section 52 of head 40 via optical fiber cable 80. Light reception section 72 includes a photoelectric conversion circuit similar to light reception section 52, and is connected to light transmission section 51 of head 40 via optical fiber cable 80. In order to monitor the state of communication via optical fiber cable 80, communication control section 75 inputs an electrical signal received via light reception section 72, and outputs communication light amount Q (light amount of an optical signal passing through optical fiber cable 80) estimated based on the input electrical signal to CPU 61.

Next, a mounting operation of component mounting machine 10 according to the embodiment configured as described above will be described. First, CPU 61 of mounting control device 60 controls head moving device 30 so that mark camera 28 moves above the reference mark attached to substrate S after substrate S is carried in and positioned by substrate conveyance device 22. This control is performed by inputting position signals from X-axis encoder 37 and Y-axis encoder 39 via input/output interface 65 by servo amplifier 63 based on a control command from CPU 61, and outputting control signals generated based on the input position signals to X-axis motor 36 and Y-axis motor 38 via input/output interface 65. Subsequently, CPU 61 controls mark camera 28 and light source unit 29 thereof so that the reference mark is imaged. The imaging is controlled by CPU 61 transmitting respective control signals to mark camera 28 and light source unit 29. As a result, the reference mark on substrate S is imaged by mark camera 28. The imaging signal from mark camera 28 is output to image processing board 64. Image processing board 64 performs image processing of recognizing a reference mark in an image based on the input image signal. CPU 61 recognizes the position of substrate S based on the image processing result of image processing board 64.

Next, CPU 61 controls head moving device 30 so that suction nozzle 41 moves above component P supplied by component supply device 21. The control of head moving device 30 has been described above. Subsequently, CPU 61 controls Z-axis motor 44 so that suction nozzle 41 moves down, and supplies a negative pressure to the suction port of suction nozzle 41. As a result, component P is picked up by suction nozzle 41. The control of Z-axis motor 44 is performed by servo amplifier 63 inputting a position signal from Z-axis encoder 47 via optical communication section 50, optical fiber cable 80, and optical communication section 70 of mounting head 40 in this order based on a control command from CPU 61, and outputting a control signal generated based on the input position signal to Z-axis motor 44 via optical communication section 70, optical fiber cable 80, and optical communication section 50 of mounting head 40 in this order. If a predetermined number of components P are not picked up by multiple suction nozzles 41 of mounting head 40, CPU 61 controls R-axis motor 42 so that suction nozzles 41 (nozzle holder) pivot by a predetermined amount until the predetermined number of components P are picked up, and repeats the picking up of components P to be picked up next to suction nozzles 41. The control of R-axis motor 42 is performed by servo amplifier 63 inputting a position signal from R-axis encoder 45 via optical communication section 50, optical fiber cable 80, and optical communication section 70 of mounting head 40 based on a control command from CPU 61, and outputting a control signal generated based on the input position signal to R-axis motor 42 via optical communication section 70, optical fiber cable 80, and optical communication section 50 of mounting head 40 in this order.

When CPU 61 performs the pickup operation for picking up component P by suction nozzle 41 in this manner, CPU 61 controls side camera 48 and light source unit 49 so that the distal end portion of suction nozzle 41 is imaged from the side every time the pickup operation is performed. The imaging is controlled by CPU 61 transmitting respective control signals to side camera 48 and light source unit 49 via optical communication section 70, optical fiber cable 80, and optical communication section 50 of mounting head 40 in this order. The imaging signal from side camera 48 is output to image processing board 64 via optical communication section 50, optical fiber cable 80, and optical communication section 70 of mounting head 40 in this order. Image processing board 64 performs image processing of recognizing component P (side surface of the component) in an image based on the input image signal. Then, CPU 61 determines the suction state of component P with respect to suction nozzle 41 (for example, the presence or absence of a pickup error or the quality of the suction posture) based on the image processing result of image processing board 64.

When the picking up of all components P to be picked up by suction nozzles 41 is completed, CPU 61 controls head moving device 30 so that mounting head 40 moves above part camera 26. Subsequently, CPU 61 controls part camera 26 and light source unit 27 so that component P picked up by suction nozzle 41 is imaged. The imaging is controlled when CPU 61 transmits respective control signals to part camera 26 and light source unit 27 via input/output interface 65. The image signal from part camera 26 is output to image processing board 64 via input/output interface 65. Image processing board 64 performs image processing of recognizing component P (lower surface of the component) in an image based on the input image signal. CPU 61 calculates a positional deviation amount (amount of pickup deviation) of component P picked up by each suction nozzle 41 based on the processing result of image processing board 64, and corrects the mounting position and the mounting angle of substrate S based on the calculated positional deviation amount. When the mounting position and the mounting angle are corrected, CPU 61 controls head moving device 30 so that component P picked up by suction nozzle 41 moves upward from the corrected mounting position. Then, CPU 61 controls 8-axis motor 43 and Z-axis motor 44 so that component P is brought to the corrected mounting angle and suction nozzle 41 is lowered, and cancels the supply of the negative pressure to the suction port of suction nozzle 41. The control of 8-axis motor 43 is performed by servo amplifier 63 inputting a position signal from 8-axis encoder 46 via optical communication section 50, optical fiber cable 80, and optical communication section 70 of mounting head 40 in this order based on a control command from CPU 61, and outputting a control signal generated based on the input position signal to 8-axis motor 43 via optical communication section 70, optical fiber cable 80, and optical communication section 50 of mounting head 40 in this order. The control of Z-axis motor 44 has been described above. As a result, component P is mounted at the mounting position and the mounting angle on substrate S. If any of suction nozzles 41 included in mounting head 40 has any unmounted component P remaining, CPU 61 repeats the mounting of component P to be mounted next, which is picked up by multiple suction nozzle 41, until all components P are mounted.

When performing the mounting operation for mounting component P on substrate S in this manner, CPU 61 controls side camera 48 and light source unit 49 so that the distal end of suction nozzle 41 is imaged from the side every time the mounting operation is performed. The control of side camera 48 and light source unit 49 has been described above. Image processing board 64 inputs the imaging signal from side camera 48 via optical communication section 50, optical fiber cable 80, and optical communication section 70, and performs image processing of recognizing component P (side surface of the component) in an image based on the input image signal. Then, CPU 61 determines whether there is a take-back error for suction nozzle 41 to take back component P without mounting component P on substrate S based on the image processing result of image processing board 64.

Figure 5:
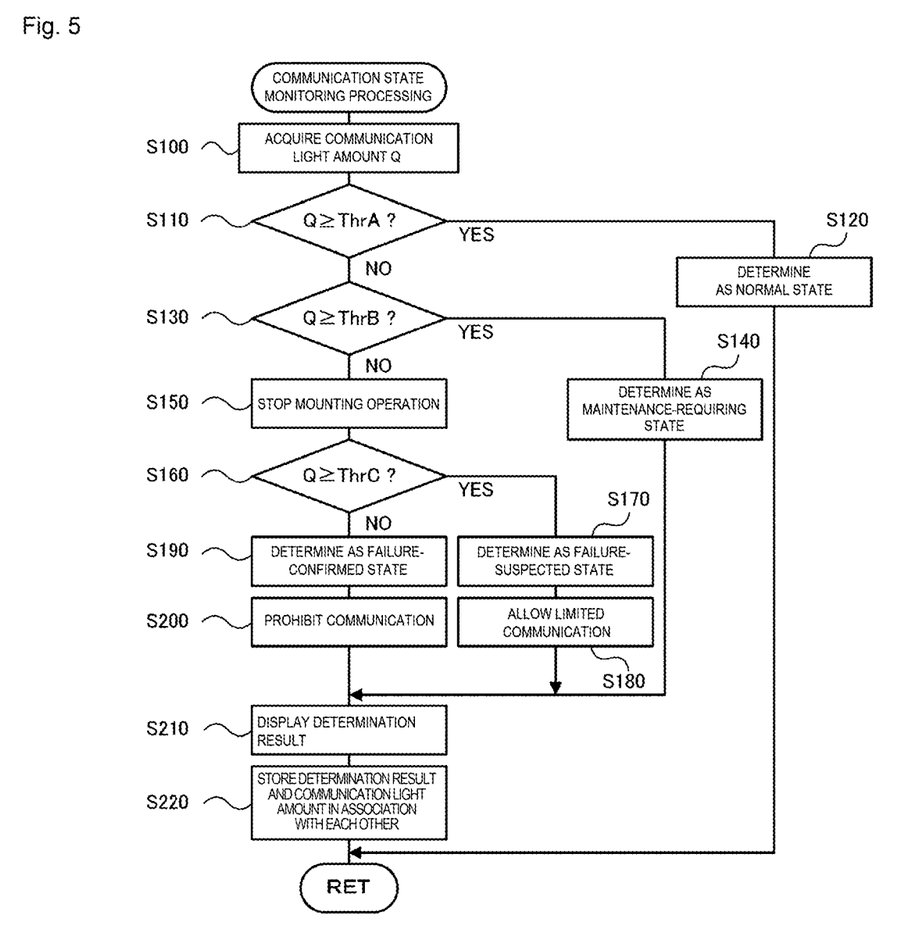
FIG. 5 is a flowchart illustrating an example of communication state monitoring processing.

Next, processing for monitoring the state of communication between mounting head 40 and mounting control device 60 via optical fiber cable 80 will be described. Here, CPU 61 and storage section 62, optical communication sections 50 and 70, and optical fiber cable 80 of mounting control device 60 correspond to the optical communication equipment of the present disclosure. FIG. 5 is a flowchart illustrating an example of the communication state monitoring processing executed by CPU 61 of mounting control device 60. This processing is repeatedly executed at predetermined time intervals during the mounting operation (during the production) of component mounting machine 10.

When the communication state monitoring processing is executed, CPU 61 of mounting control device 60 first acquires the light amount (communication light amount Q) of the optical signal passing through optical fiber cable 80 (S100). This processing is performed by acquiring an estimate based on the electrical signal received through light reception section 72. Subsequently, CPU 61 determines whether acquired communication light amount Q is equal to or higher than threshold value ThrA (first threshold value) (S110). Threshold value ThrA is a threshold value for determining whether the communication state is normal, and is defined as a value larger than a lower limit value of a normal range in which communication errors hardly occur. When determining that communication light amount Q is equal to or higher than threshold value ThrA, CPU 61 determines that communication light amount Q is at a sufficient level and the communication state is in the normal state (S120), and ends the communication state monitoring processing.

Figure 6:
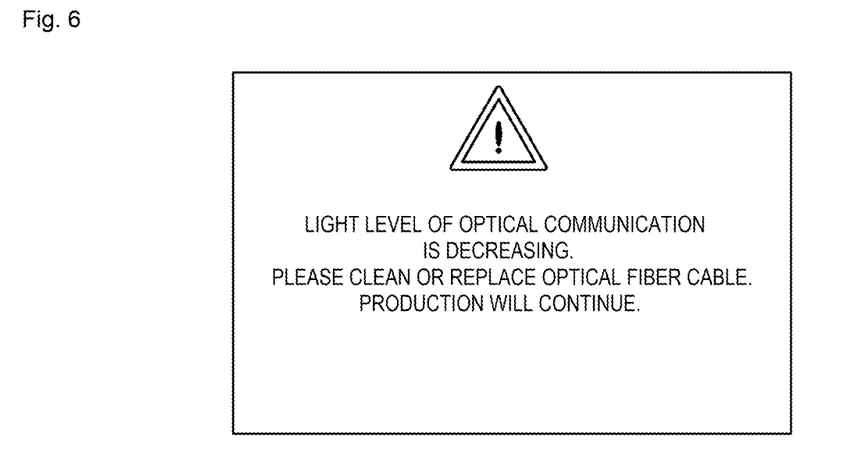
FIG. 6 is an explanatory view illustrating a display example of a display device

When determining that acquired communication light amount Q is less than threshold value ThrA in S110, CPU 61 determines whether communication light amount Q is equal to or higher than threshold value ThrB (third threshold value) defined as a value smaller than threshold value ThrA (S130). Threshold value ThrB is defined as a lower limit value of the normal range. When determining that communication light amount Q is equal to or higher than threshold value ThrB (equal to or higher than threshold value ThrB and less than threshold value ThrA, equal to or higher than the third threshold value and less than the first threshold value), CPU 61 determines that the communication state is a maintenance-requiring state requiring maintenance of optical fiber cable 80 or the like (S140), and outputs the determination result to display device 25 (S210). FIG. 6 is an explanatory view illustrating a display example of display device 25. As illustrated in the drawing, in a case where it is determined that maintenance is required, a message or the like for prompting the operator to clean or replace optical fiber cable 80 is displayed on display device 25. The operator can restore the communication state to the normal state by performing necessary operations in accordance with the message displayed on display device 25. Then, CPU 61 stores the determination result (maintenance-requiring state) and communication light amount Q acquired in S100 in association with each other in storage section 62 (S220), and ends the communication state monitoring processing.

When determining that acquired communication light amount Q is less than threshold value ThrB (less than the third threshold value) in S130, CPU 61 determines that there is a suspicion of a communication failure, and stops the mounting operation (production) of component mounting machine 10 (S150). This is because, when a communication failure occurs, CPU 61 cannot normally control mounting head 40 (respective axis motors including R-axis motor 42, θ-axis motor 43, Z-axis motor 44, side camera 48, and the like).

Figure 7:
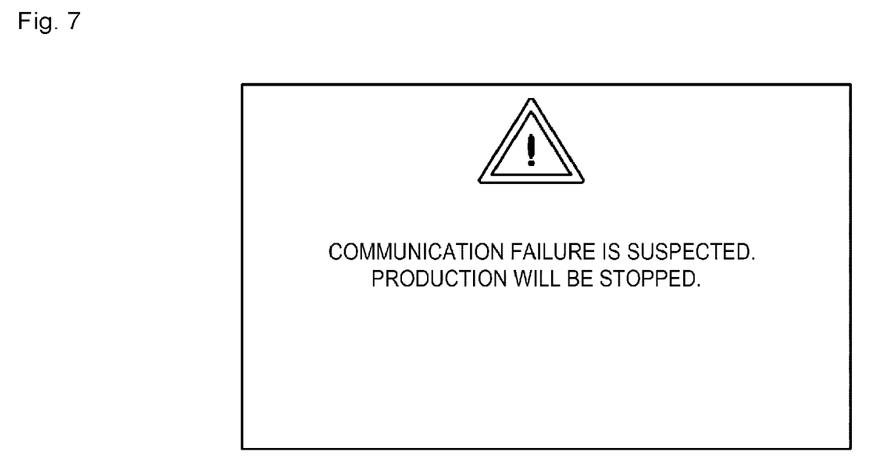
FIG. 7 is an explanatory view illustrating a display example of a display device

Then, CPU 61 determines whether acquired communication light amount Q is equal to or higher than threshold value ThrC (second threshold value) defined as a value further smaller than threshold value ThrB (S160). Threshold value ThrC is a threshold value for determining an obvious communication failure. When determining that acquired communication light amount Q is equal to or higher than threshold value ThrC (equal to or higher than threshold value ThrC and less than threshold value ThrB, equal to or higher than the second threshold value and less than the third threshold value), CPU 61 determines that the communication state is a failure-suspected state in which communication failure is suspected (S170), and allows only limited communication (S180). Examples of the limited communication include a case where communication is performed with each of axis encoders 45 to 47, side camera 48, or the like in order to check whether there is an abnormality in each of axis encoders 45 to 47 or side camera 48, to check whether there is a disconnection in a signal line, or the like. In addition, the limited communication may be performed, for example, in a case where a memory or the like is provided in a communication destination, in order to check the memory to check whether an abnormality has occurred in the past. Subsequently, CPU 61 displays the determination result (failure-suspected state) on display device 25 (S210). FIG. 7 is an explanatory view illustrating a display example of display device 25. When it is determined that an abnormality is suspected, a message indicating that a suspected communication failure has occurred and a message indicating that production is stopped are displayed on display device 25 to the operator. Then, CPU 61 stores the determination result (failure-suspected state) and communication light amount Q acquired in S100 in association with each other in storage section 62 (S 220), and ends the communication state monitoring processing.

Figure 8:
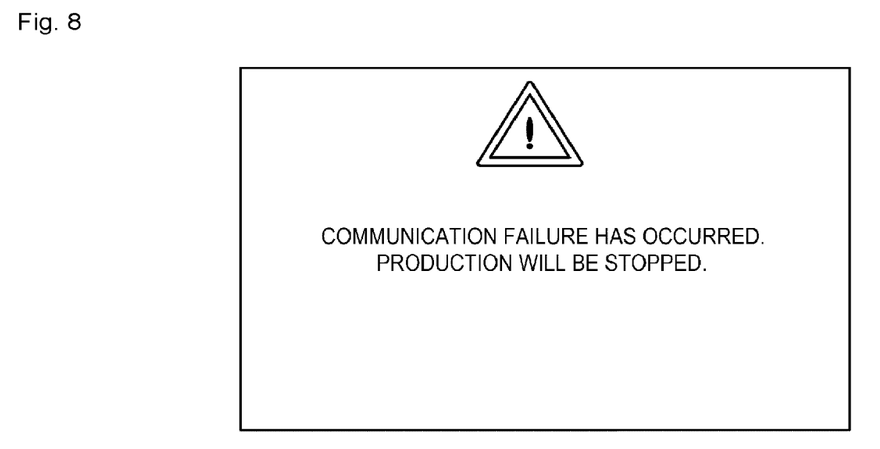
FIG. 8 is an explanatory view illustrating a display example of a display device

When determining that acquired communication light amount Q is less than threshold value ThrC (less than the second threshold value) in S160, CPU 61 determines that the communication state is a failure-confirmed state (S190), and prohibits all communications (S200). Subsequently, CPU 61 displays the determination result (failure-confirmed state) on display device 25 (S210). FIG. 8 is an explanatory view illustrating a display example of the display device 25. In a case where it is determined that an abnormality is confirmed, a message indicating that a communication failure has occurred and a message indicating that production is stopped are displayed on display device 25 to the operator. Then, CPU 61 stores the determination result (failure-confirmed state) and communication light amount Q acquired in S100 in association with each other in the storage section 62 (S 220), and ends the communication state monitoring processing.

As described above, in the present embodiment, CPU 61 determines the communication state and notifies the operator of the determination result by gradually determining the decrease of communication light amount Q by using multiple threshold values ThrA to ThrC. As a result, it is possible to prompt the operator to appropriately respond to the current communication state. In a case where the determination result is other than a normal state (a maintenance-requiring state, a failure-suspected state, or a failure-confirmed state), CPU 61 stores the determination result in storage section 62 together with communication light amount Q at that time. As a result, when a person in charge of development or a person in charge of maintenance later analyzes a cause of the failure or the like, the analysis can be facilitated.

Here, the correspondence between the constituent elements of the embodiment and the constituent elements of the present disclosure described in the scope of the claims will be clarified. The mounting machine body including substrate conveyance device 22, head moving device 30, and mounting control device 60 according to the embodiment corresponds to the first apparatus of the present disclosure, mounting head 40 corresponds to the second apparatus, communication control section 75 of optical communication section 70 of mounting control device 60 corresponds to the monitoring section, and CPU 61 of mounting control device 60 corresponds to the control device. In addition, light transmission section 71 and light reception section 72 of optical communication section 70 correspond to a first conversion unit, light transmission section 51 and light reception section 52 of optical communication section 50 of mounting head 40 correspond to a second conversion unit, optical fiber cable 80 corresponds to an optical fiber cable, and storage section 62 of mounting control device 60 corresponds to a storage section. In addition, R-axis motor 42, θ-axis motor 43, and Z-axis motor 44 correspond to motors, R-axis encoder 45, θ-axis encoder 46, and Z-axis encoder 47 correspond to encoders, and servo amplifier 63 corresponds to a motor control section. In addition, side camera 48 corresponds to an imaging device, and image processing board 64 corresponds to an image processing section.

The present disclosure is not limited in any way to the embodiment that has been described heretofore, and hence, needless to say, the present disclosure can be carried out in various forms without departing from the technical scope of the present disclosure.

For example, in the above embodiment, when it is determined in S130 that communication light amount Q is less than threshold value ThrB, CPU 61 further determines in S160 whether communication light amount Q is equal to or higher than threshold value ThrC, thereby distinguishing the failure-suspected state from the failure-confirmed state. However, when determining that communication light amount Q is less than threshold value ThrB in S 130, CPU 61 may determine the failure state without distinguishing the failure-suspected state from the failure-confirmed state. In this case, CPU 61 may prohibit any communication.

In the above embodiment, CPU 61 stores acquired communication light amount Q in storage section 62 in a case where communication light amount Q is less than threshold value ThrA (in a case where the communication state is a state other than the normal state). However, CPU 61 may store acquired communication light amount Q in storage section 62 at all times. In this case, when the storage capacity of storage section 62 is full, CPU 61 may overwrite the old data in order. In addition, CPU 61 needs not cause storage section 62 to store communication light amount Q.

In the above embodiment, mounting head 40 is configured as a rotary head in which multiple suction nozzles 41 are arranged in the circumferential direction, and suction nozzles 41 at predetermined pivoting positions can be lifted and lowered by Z-axis motor 44. However, in mounting head 40, multiple suction nozzles 41 that can be individually lifted and lowered by Z-axis motor may be arranged in a linear direction. In addition, mounting head 40 may include a single suction nozzle that can be lifted and lowered by the Z-axis motor.

In the above embodiment, the optical communication equipment of the present disclosure is applied to component mounting machine 10. However, the optical communication equipment is not limited thereto, and is applicable to any equipment as long as the equipment performs optical communication between a first apparatus and a second apparatus.

As described above, the optical communication equipment according to the present disclosure includes an optical communication equipment that performs optical communication between the first apparatus and the second apparatus, the monitoring section that monitors the light amount during optical communication, and the control device that outputs predetermined information when the light amount is less than the first threshold value, and that shuts off communication between the first and second apparatuses when the light amount is less than the second threshold value that is lower than the first threshold value.

In the optical communication equipment of the present disclosure, since predetermined information is output when the light amount during optical communication is less than the first threshold value, for example, an operator who has received a warning based on the information performs necessary maintenance, whereby the equipment can be kept normal. In addition, in the optical communication equipment of the present disclosure, since the communication between the first and second apparatuses is shut off when the light amount is less than the second threshold value lower than the first threshold value, it is possible to suppress the equipment from malfunctioning due to the decrease in the light amount during the optical communication. Here, the "outputting predetermined information" includes outputting (recording) predetermined information to a storage device, displaying predetermined information, and warning or notifying the operator.

In such an optical communication equipment of the present disclosure, the control device may perform communication between the first and second apparatuses in a limited manner when the light amount is less than the third threshold value lower than the first threshold value and higher than the second threshold value. Accordingly, it is possible to continue necessary communication while suppressing the malfunction of the equipment. In this case, the control device may be provided on the first apparatus side, and the communication performed in the limited manner may include communication for checking whether the second apparatus is abnormal.

The optical communication equipment according to the present disclosure may include the first conversion unit provided on the first apparatus side for converting an electrical signal into an optical signal, the second conversion unit provided on the second apparatus side for converting an electrical signal into an optical signal, the optical fiber cable connecting the first conversion unit and the second conversion unit, and a storage section for storing a received light amount of an optical signal received by the first conversion unit from the second conversion unit via the optical fiber cable. By storing the received light amount in the storage section, it is possible to facilitate the analysis in a case where the cause of the occurrence of the failure is analyzed later. The light amount may be stored only when the light amount is less than the first threshold value. By doing so, it is possible to reduce the necessary storage capacity.

In the optical communication equipment according to the present disclosure, the first apparatus may be a fixed apparatus, and the second apparatus may be a movable apparatus.

The present disclosure may also be in the form of a component mounting machine, which is limited to the form of an optical communication equipment. That is, the component mounting machine of the present disclosure is a component mounting machine for mounting components, including the optical communication equipment according to any one of the above aspects of the present disclosure, a mounting machine body as a first apparatus, and a mounting head as a second apparatus that moves with respect to the mounting machine body to mount components, in which the mounting head may include a motor and an encoder that detects displacement of the motor, and the mounting machine body may include a motor control section that receives an encoder signal output from the encoder via the optical communication equipment and transmits a control signal to the motor via the optical communication equipment to control and drive the motor. In this case, the mounting head may include an imaging device, and the mounting machine body may include an image processing section that receives and processes an image signal output from the imaging device via the optical communication equipment.

INDUSTRIAL APPLICABILITY

The present disclosure can be applied to a manufacturing industry of an optical communication equipment or a component mounting machine.

REFERENCE SIGNS LIST 10 component mounting machine
11 base
12 housing
21 component supply device
22 substrate conveyance device
25 display device
26 part camera
27 light source unit
28 mark camera
29 light source unit
30 head moving device
31 X-axis guide rail
32 X-axis slider
33 Y-axis guide rail
34 Y-axis slider
36 X-axis motor
37 X-axis encoder
38 Y-axis motor
39 Y-axis encoder
40 mounting head
41 suction nozzle
42 R-axis motor
43 θ-axis motor
44 Z-axis motor
45 R-axis encoder
46 θ-axis encoder
47 Z-axis encoder
48 side camera
49 light source unit
50, 70 optical communication section
51, 71 light transmission section
52, 72 light reception section
53, 73 multiplexing section
54, 74 demultiplexing section
55, 75 communication control section
60 mounting control device
61 CPU
62 storage section
63 servo amplifier
64 image processing board
65 input/output interface
80 optical fiber cable
P component
S substrate

The invention claimed is:

1. An optical communication equipment for performing optical communication between a first apparatus and a second apparatus, comprising:
a monitoring section configured to monitor a light amount during the optical communication; and
a control device configured to
output predetermined information when the light amount is less than a first threshold value and shut off communication between the first and second apparatuses when the light amount is less than a second threshold value lower than the first threshold value, and
perform communication between the first and second apparatuses in a limited manner which includes checking whether there is an abnormality in at least one of the first apparatus or the second apparatus, when the light amount is less than a third threshold value lower than the first threshold value and higher than the second threshold value.

2. The optical communication equipment according to claim 1, wherein
the control device is provided on a first apparatus side, and
the communication performed in the limited manner includes communication for checking whether the abnormality is in the second apparatus.

3. The optical communication equipment according to claim 1, further comprising:
a first conversion unit provided on a first apparatus side to convert an electrical signal into an optical signal;
a second conversion unit provided on a second apparatus side to convert an electrical signal into an optical signal;
an optical fiber cable configured to connect the first conversion unit and the second conversion unit; and
a storage section configured to store a received light amount of an optical signal received by the first conversion unit via the optical fiber cable from the second conversion unit.

4. The optical communication equipment according to claim 1, wherein
the first apparatus is a fixed apparatus, and
the second apparatus is a movable apparatus.

5. A component mounting machine for mounting a component, comprising:
a mounting machine body;
a mounting head that moves with respect to the mounting machine body to mount a component; and an optical communication equipment for performing optical communication between the mounting machine and the mounting head, including:
    a monitoring section configured to monitor a light amount during the optical communication, and
    a control device configured to output predetermined information when the light amount is less than a first threshold value and shut off communication between the mounting machine and the mounting head when the light amount is less than a second threshold value lower than the first threshold value, wherein
the mounting head includes a motor and an encoder configured to detect displacement of the motor, and
the mounting machine body includes a motor control section configured to drive and control the motor by receiving an encoder signal output from the encoder via the optical communication equipment and transmitting a control signal to the motor via the optical communication equipment.

6. The component mounting machine according to claim 5, wherein
the mounting head includes an imaging device, and
the mounting machine body includes an image processing section configured to receive and process an image signal output from the imaging device via the optical communication equipment.

* * * * *